United States Patent [19]
Lischke et al.

[11] Patent Number: 4,514,638
[45] Date of Patent: Apr. 30, 1985

[54] ELECTRON-OPTICAL SYSTEM WITH VARIABLE-SHAPED BEAM FOR GENERATING AND MEASURING MICROSTRUCTURES

[75] Inventors: Burkhard Lischke, Munich; Juergen Frosien, Ottobrunn; Klaus Anger; Erich Plies, both of Munich, all of Fed. Rep. of Germany

[73] Assignee: Siemens Aktiengesellschaft, Berlin & Munich, Fed. Rep. of Germany

[21] Appl. No.: 643,108

[22] Filed: Aug. 22, 1984

Related U.S. Application Data

[63] Continuation of Ser. No. 398,559, Jul. 15, 1982.

[30] Foreign Application Priority Data

Sep. 30, 1981 [DE] Fed. Rep. of Germany ....... 3138896

[51] Int. Cl.³ .................. H01J 37/145; H01J 37/30
[52] U.S. Cl. .................. 250/492.2; 250/398
[58] Field of Search .................. 250/492.2, 398

[56] References Cited

U.S. PATENT DOCUMENTS

| | | | |
|---|---|---|---|
| 3,777,211 | 12/1973 | Kuijpers | 250/396 X |
| 4,117,340 | 9/1978 | Goto et al. | 250/492.2 |
| 4,145,597 | 3/1979 | Yasuda | 250/492.2 X |
| 4,258,265 | 3/1981 | Sumi | 250/492.2 |
| 4,263,514 | 4/1981 | Reeds | 250/492.2 |
| 4,393,308 | 7/1983 | Anger et al. | 250/396 R |

Primary Examiner—Alfred E. Smith
Assistant Examiner—Jack I. Berman
Attorney, Agent, or Firm—Hill, Van Santen, Steadman & Simpson

[57] ABSTRACT

An electron-optical system with a variable-shaped beam for generating and measuring microstructures, such as circuits on a semiconductor substrate, generates the variable-shaped electron beam by the use of electron-optical shadow projection imaging and has a remote focus multipole Wehnelt electrode for adjusting, focusing, and controlling the intensity of the electron beam. The system also has a ferrite polecylinder in the beam projections lens with field attenuation or may have a beam projection lens with an external air gap. The length of the electron beam is approximately 60 centimeters.

17 Claims, 13 Drawing Figures

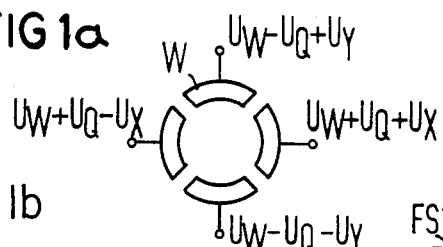
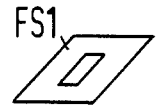
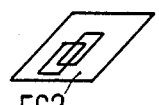
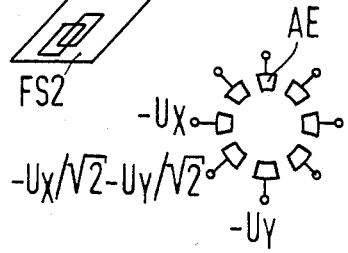
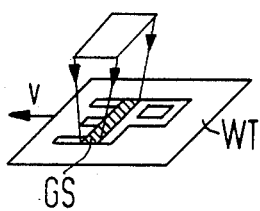
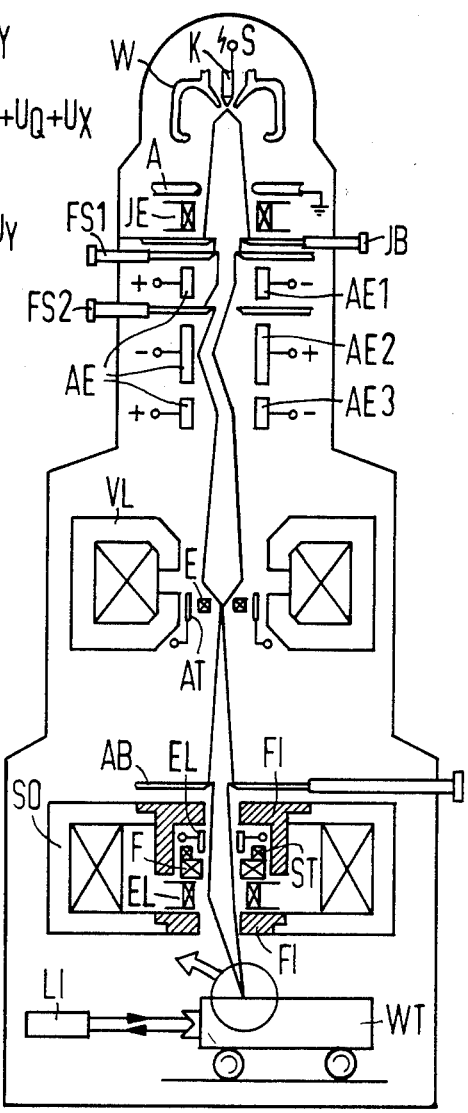

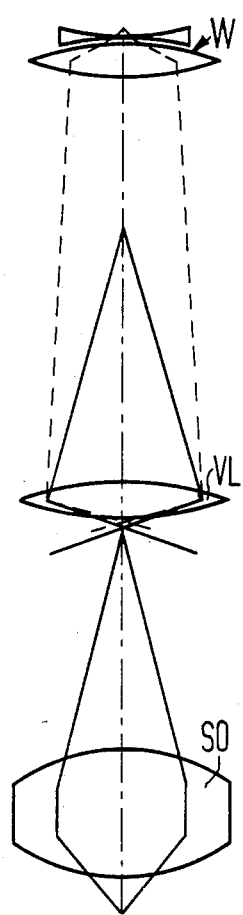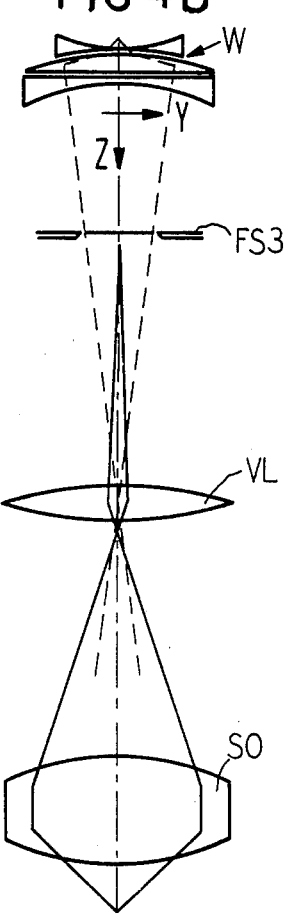

ELECTRON-OPTICAL SYSTEM WITH VARIABLE-SHAPED BEAM FOR GENERATING AND MEASURING MICROSTRUCTURES

This is a continuation of application Ser. No. 398,599 filed July 15, 1982.

BACKGROUND OF THE INVENTION

1. Field of the Invention

The present invention relates to electron-optical systems with variable-shaped beams for generating and measuring microstructures, and in particular to such a system which minimizes the number of beam crossover points and significantly shortens the electron beam path.

2. Description of the Prior Art

Electron-optical lithography devices which are utilized to radiate a resist wafer with a fine electron beam probe for generating a structure pattern thereon are increasingly being employed for generating circuit patterns and structures on semiconductor substrates. Because of the increasingly smaller dimensions of such structures and circuits, the edge definition of the electron beam probe which is utilized to generate the patterns and structures must have a correspondingly improved edge definition given a high probe current. A problem in the design and construction of such electron-optical lithography devices is that the energy and direction of the electrons in the electron beam are changed as a result of interaction of the electrons (Boersch effect) which causes a deterioration in the edge definition of the beam given an increasing beam current. Similar problems also apply to electron beam measuring installations, which also require a highly-defined electron probe with a high probe current.

An electron beam lithography device with a variable-shaped beam is described in the article "Recent Advances in Electron-Beam Lithography for the High-Volume Production of VLSI Devices," Pfeiffer, IEEE Trans. on Electron Devices, Vol. ED-26, No. 4, April, 1979, pages 663–674. In this known electron-optical system, a shaped beam which can be matched to the structure to be generated is moved over a target, such as a resist wafer. In view of the Boersch effect, this known electron-optical system has the disadvantage of an electron beam path of a relatively large length of more than one meter, and a relatively large number of beam intersection or crossover points; the system having a total of five such points. The length of the beam path and the number of locations where the electrons come together particularly tightly promote mutual interaction of the electrons which undesireably leads to the Boersch effect. Apart from the Boersch effect, the large number of lenses (five) and their relatively complicated structure contribute to increased cost in manufacturing and operating such a system.

SUMMARY OF THE INVENTION

It is an object of the present invention to provide an electron-optical system with a variable-shaped beam for generating and measuring microstructures which is of economical construction and which minimizes occurrence of the Boersch effect.

The above objects are inventively achieved in an electron-optical system wherein the Boersch effect is minimized by significantly shortening the beam path to a length of approximately 60 centimeters and by reducing the number of electron beam crossover points to three. The system employs the so-called "shadow projection" technique of disposing one or more slot diaphragms in the electron beam path and displacing the electron beam relative to the optical axis of the system such that only a portion of the electron beam which passes through a slot in a first diaphragm in the direction of beam travel passes through the slot of a subsequent diaphragm, so that a very narrow beam emerges from the final diaphragm.

The system constructed in accordance with the principles of the present invention also employs a remote focus multipole Wehnelt electrode for adjusting, focusing and controlling the intensity of the electron beam. The multipole Wehnelt electrode is utilized to initially focus the electron beam into a narrow line, the length of which can then be shaped by the shadow projection technique described above. By appropriately changing the Wehnelt voltages, the electron beam line can be rotated with respect to the diaphragms employed in the shadow projection technique so as to generate an electron beam of a shape and size most favorable for generating a desired circuit pattern on the target.

The projection lens of the system may utilize a ferrite polecylinder with field attenuation in which both the source-side and the target-side bores of the ferrite polecylinder are smaller than the radial dimensions of the deflection elements or the dynamic focusing coil which are utilized in conjunction with the projection lens.

In another embodiment the projection lens has an air gap such that the lens field is disposed at the exterior of the lens body which permits the deflection elements associated with the projection lens to be disposed at a location where the deflection elements are relatively free of disruption due to eddy currents.

BRIEF DESCRIPTION OF THE DRAWINGS

FIG. 1 is a side view of an electron-optical lithography device constructed in accordance with the principles of the present invention.

FIG. 1a is a plan view of the Wehnelt electrode which is used in the system of FIG. 1.

FIG. 1b shows the relationship of the slots in two diaphragms which are employed in the system of FIG. 1 for the shadow projection beam-shaping technique.

FIG. 1c is a plan view of the position of the electrodes in the deflection systems which are utilized in the upper portion of the system shown in FIG. 1.

FIG. 1d shows the electron beam generated by the system of FIG. 1 incident on a resist wafer.

FIG. 2 is a schematic representation of the beam path for the system shown in FIG. 1.

FIG. 4a is a schematic representation of the beam path for the electron beam in the system shown in FIG. 3 in the x-z plane.

FIG. 4b is a schematic representation of the beam path for the electron beam of the system shown in FIG. 3 in the y-z plane.

DESCRIPTION OF THE PREFERRED EMBODIMENTS

Figure 3A:
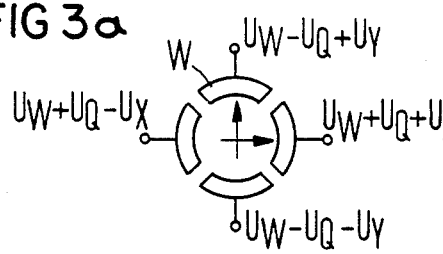
FIG. 3a is a plan view of the Wehnelt electrode which is utilized in the system shown in FIG. 3.

A first embodiment of an electron-optical lithography device constructed in accordance with the principles of the present invention is shown in FIG. 1. The lithography device is characterized by (a) a beam shaping means operating according to the electron-optical shadow projection imaging technique, (b) the use of only two magnetic lenses (VL and SO), (c) a reduced number of beam intersection points, the system having only three beam crossover points, and (d) the length of the beam path is shortened to approximately 60 centimeters in contrast to beam paths of approximately 1 meter in conventional electron-optical systems.

An electron beam is generated by an electron source K, which may be a cathode supplied with a voltage S, and a Wehnelt electrode W, the details of which are more fully described below. The beam passes through an anode A, a beam adjusting element JE and a beam-adjusting diaphragm JB before reaching a first shaped beam diaphragm FS1, which may have a slot having dimensions 50 μm×200 μm. Because of the high current density of the primary electron beam, and in order to avoid unwanted interaction with the electron beam, the adjustment diaphragm JB, the slot diaphragms FS1 and FS2, and the beam blanking diaphragm AB preferably consist of enameled carbon or of a metal with a high melting temperature with a graphite coating. The portion of the primary electron beam which is permitted to pass through the shaped beam slot diaphragm FS1 radiates a second shaped beam slot diaphragm FS2. A first electrical deflection system AE1 is disposed between the diaphragms FS1 and FS2 for deflecting the electron beam in its travel between the diaphragms FS1 and FS2 such that the shadow projection of the electron beam on the second diaphragm FS2 is not in registry with the slot of that diaphragm. Thus a very narrow electron beam emerges from the second diaphragm FS2, which is returned to the optical axis by a subsequent second electrical deflection system AE2 and a third electrical deflection system AE3. The position of the projection of the electron beam on the second diaphragm FS2 is shown in FIG. 1b wherein the central rectangular opening in the diaphragm FS2 is the slot for that diaphragm and the off-center rectangle is the beam image or projection on the diaphragm.

The arrangement of the electrodes AE for each of the beam deflection systems AE1, AE2 and AE3 is shown in FIG. 1c. Each electrical deflection system is formed of eight deflection elements or electrodes AE. The edge distinction of the beam cross-section generated by the system depends upon the spacing and diameter of the electron source and can be adjusted in accordance with requirements. Each of the eight electrodes AE in the deflection systems AE1, AE2 and AE3 are in registry, however, the eight electrodes AE of the second deflection system AE2 have a voltage polarity which is opposite that of the polarity of the electrodes AE of the first and third deflection systems AE1 and AE3. The electrodes AE of the second deflection system AE2 are exactly twice as long in the direction of beam travel as the electrodes AE of the deflection systems AE1 and AE3, which have electrodes AE of equal length in the direction of beam travel. The magnitudes of the voltages supplied to each of the electrodes in the systems AE1, AE2 and AE3 begin cyclically at any electrode (in registry in the three deflection systems) with $U_y$ and continues with voltages $U_x/\sqrt{2} + U_y/\sqrt{2}$; $U_x$; $U_x/\sqrt{2} - U_y/\sqrt{2}$; $-U_y$; $U_x/\sqrt{2} - U_y/\sqrt{2}$; $-U_x$; and $-U_x/\sqrt{2} + U_y/\sqrt{2}$.

After the beam is returned to optical axis by the deflection systems AE2 and AE3 the electron beam is reduced in the intermediate image plane by, for example, 50 times, by means of a magnetic condenser lens VL. A beam blanking system AT and a quadrupole distortion corrector E for correcting misrecording are also disposed in the intermediate image plane.

The electron beam then travels to the beam blanking diaphragm AB which is disposed immediately in front of a beam projection lens SO. The intermediate image of the electron beam cross-section is again reduced approximately three times and is directed as a probe GS onto a resist wafer which may be mounted on a wafer table WT, as shown in FIG. 1d. The lens of the projection lens SO contains electromagnetic deflection systems comprised of deflection elements EL, a dynamic fine focus coil F with compensated image rotation and a stigmator ST.

The wafer table WT on which the resist wafer is mounted may be movable in the direction v by a laser interferometer LI.

The projection lens SO has a lens field such that image faults and the deflection elements EL are as small as possible and the field at the location of the workpiece to be processed on the wafer table WT is also as small as possible. The polecylinders FI of the projection lens SO have identical bore dimensions such that the source-side as well as the targetside bores of the polecylinders FI are less than the radial dimensions of the deflection elements EL or the dynamic focusing coil F. The polecylinders FI are preferably comprised of ferrite so that the magnetic deflection system comprised of the deflection elements EL induces no disruptive eddy currents.

A suitable electron beam generator consists of a LaB$_6$ electron radiator K with a specially-shaped multipole Wehnelt electrode W. A multipurpose remote focus Wehnelt electrode W may include quadrupole deflection elements with cyclical voltages as shown in FIG. 1a of $U_W - U_Q + U_Y$; $U_W + U_Q + U_X$; $U_W - U_Q - U_Y$; and $U_W + U_Q - U_X$. By selection of a feed voltage S for the radiator K, the crossover of the primary electron beam is displaced behind the anode A so that no beam crossover point arises in the area of low primary electron energy, such that the disruptive interaction of the electrons (Boersch effect) is reduced. By means of auxiliary voltages $U_W$ and $U_Q$ at the multipole Wehnelt electrode W, the primary electron beam can be adjusted with respect to the optical axis and the shape of the beam on the slot diaphragm FS1 can be suitably selected.

A schematic representation of the beam path in the embodiment of FIG. 1 is shown in FIG. 2. The electron beam is adjusted by the lens of the multipole Wehnelt electrode W along the optical axis. The shaped beam cross-section formed by the slot diaphragms FS1 and FS2 is reduced in the intermediate image plane through the magnetic condenser lens. Finally, by means of the projection lens SO, the intermediate image of the beam cross-section is again reduced and correspondingly deflected onto the target.

Figure 3B:
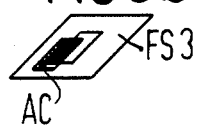
FIG. 3b shows a slot diaphragm employed in the shadow projection beam-shaping technique in the system shown in FIG. 3.
Figure 3C:
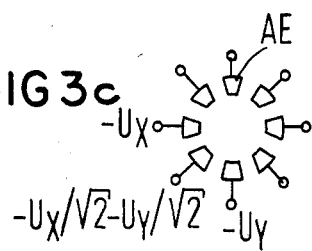
FIG. 3c is a plan view of the electrodes of the deflection systems employed in the upper portion of the system shown in FIG. 3.
Figure 3D:
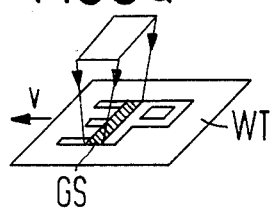
FIG. 3d shows the electron beam generated by the system of FIG. 3 incident on a resist wafer.
Figure 3:
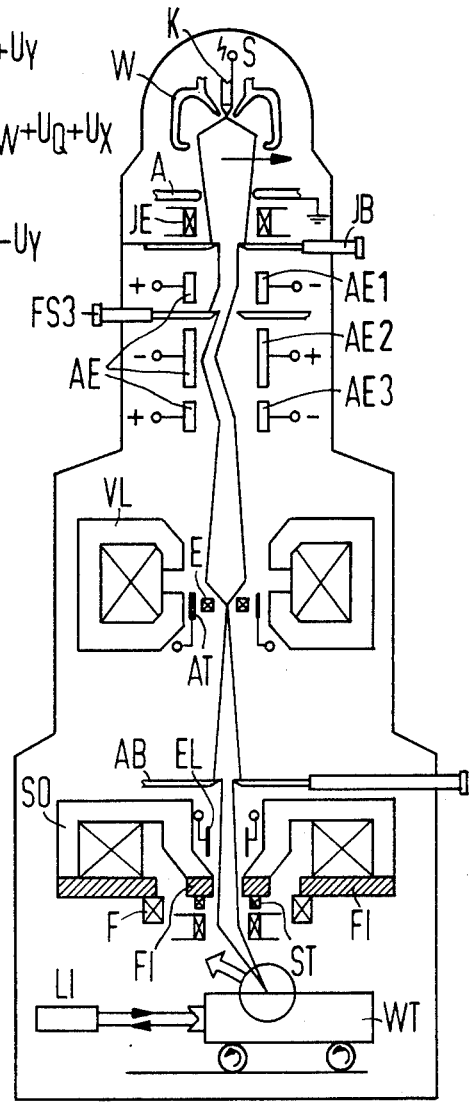
FIG. 3 is a side view of a second embodiment of an electron-optical lithography device constructed in accordance with the principles of the present invention.

A second embodiment of an electron-optical system in accordance with the principles of the present invention is shown in FIG. 3. The embodiment shown in FIG. 3 has essentially two differences from the embodiment shown in FIG. 1, namely, the shaped beam slot diaphragm FS3 and a differently-constructed projection lens SO. The remaining elements in the embodiment shown in FIG. 3 are the same as those shown in the embodiment of FIG. 1 and are identically referenced. The embodiment shown in FIG. 3 exhibits a different type of shaped-beam generation. By means of the multipole Wehnelt electrode W, the electron beam is focused to a line whose length can be suitably set by means of shifting the electron beam across the shaped beam slot diaphragm FS3 by means of the deflection system AE1. By changing the auxiliary Wehnelt voltages $U_W$ and $U_Q$ the line of the electron beam generated by the Wehnelt electrode W can be rotated such that, in combination with the slot diaphragm FS3, the beam is disposed in a favorable direction for generating the desired circuit pattern on the target. The electron beam line can be rotated by 90° with the quadrupole Wehnelt electrode W shown in FIG. 3a. Random directions of this line may be generated, for example, with an octupole Wehnelt electrode W of the type described in FIG. 6 of German patent application No. P 30 10 815.7 corresponding to copending U.S. application Ser. No. 240,881 filed on Mar. 5, 1981, the teachings of which are incorporated herein by reference. A random direction of the astigmatic crossover AC as shown in FIG. 3b can be achieved, for example, with an octupole Wehnelt electrode W which is constructed of two quadrupole Wehnelt electrodes which are rotated relative to one another by 45° and which are respectively supplied with independently controlled currents. A random direction of the astigmatic crossover AC may, however, also be achieved with further modifications of high current electron sources as described in the copending U.S. application.

The second difference in the system shown in FIG. 3 with respect to the system shown in FIG. 1 relates to the construction of the projection lens SO. In the embodiment shown in FIG. 3, the air gap of the projection lens SO is such that the lens field is disposed at the exterior of the lens body. The high frequency deflection systems formed by the deflection elements EL can thus be disposed in such a manner that no disruptive influence is present in the proximity of the deflection elements EL due to eddy currents.

The beam path for the system shown in FIG. 3 is shown in the x-z plane in FIG. 4a and in the y-z plane in FIG. 4b. By means of the multipole Wehnelt electrode W, the electron intensity is focused to a line on the slot diaphragm FS3. The length of the line, as stated above, on the diaphragm FS3 can be suitably set by means of shifting the electron projection with regard to the slot in the diaphragm FS3.

The astigmatic crossover AC (intersection line) on the diaphragm FS3 is reduced in the intermediate image plane by the magnetic condenser lens VL. By means of the projection lens SO, the reduced intermediate image of the beam cross-section (the astigmatic crossover AC) is further reduced onto the target.

A probe size of one micrometer ×5 micrometers with a probe current of two microamperes with an edge definition of 0.25 micrometers and an image field without dynamic correction of one mm by one mm can be achieved with the electron-optical system disclosed and claimed herein.

It will be understood that while the systems disclosed herein have been described in the context of electron beam lithography devices, the inventive concept disclosed herein has equal application to other electron beam devices, such as electron beam measuring installations.

Although modifications and changes may be suggested by those skilled in the art it is the intention of the inventors to embody within the patent warranted hereon all changes and modifications as reasonably and properly come within the scope of their contribution to the art.

We claim as our invention:

1. An electron-optical system with a variable-shaped beam for generating and measuring microstructures at a beam target comprising in succession in the direction of beam travel:

an electron source for generating an electron beam;

a first lens means for focusing said electron beam which is a remote focus multipole Wehnelt electrode disposed adjacent to said electron source;

at least one slot diaphragm for shaping the cross-section of said electron beam;

a second lens means for generating an image of the shaped beam cross-section onto an intermediate image plane; and a third lens means for projecting said intermediate image of said shaped beam cross-section onto said target said first, second and third lens means and said slot diaphragm operating in combination as a shadow projection imaging means for generating said variable-shaped beam and said electron-optical system having no more that three lenses between said electron source and said target location.

2. The electron-optical system of claim 1 wherein said third lens means is a projection lens disposed immediately above said target location in the direction of beam travel and having a ferrite polecylinder with field attenuation.

3. The electron-optical system of claim 2 wherein said projection lens further comprises a dynamic focusing coil and a plurality of beam deflecting elements and wherein said polecylinder has a bore through which said beam travels having smaller radial dimensions than the radial dimensions of said dynamic focusing coil and said beam deflecting elements.

4. The electron-optical system of claim 1 wherein said third lens means is a projection lens disposed immediately above said target location in a direction of beam travel having an external air gap.

5. The electron-optical system of claim 1 further comprising a magnetic condenser lens and a magnetic projection lens successively disposed between said means for generating said variable-shaped beam and said target location.

6. The electron-optical system of claim 1 wherein said electron beam has a beam path defined by the distance between said electron source and said target location of approximately 60 centimeters.

7. The electron-optical system of claim 1 further comprising:

a second slot diaphragm;

a first beam deflection system; and a third slot diaphragm, said second slot diaphragm, said first beam deflection system and said third slot diaphragm being successively disposed in the direction of travel of said beam after said first slot diaphragm and before said second lens means, said first deflection system deflecting said electron beam with respect to an optical axis of said electron-optical system after passage of said beam through second slot diaphragm such that only a portion of the beam emerging from said second slot diaphragm passes through said third slot diaphragm.

8. The electron-optical system of claim 8 further comprising:
a second beam deflection system and a third beam deflection system successively disposed in a direction of beam travel after said third slot diaphragm for returning said beam to said optical axis.

9. The electron-optical system of claim 8 wherein said second and third slot diaphragm are comprised of enameled carbon.

10. The electron-optical system of claim 8 wherein said second and third slot diaphragms consist of a metal having a high melting point with a graphite coating.

11. The electron-optical system of claim 1 wherein said slot diaphragm consists of enameled carbon.

12. The electron-optical system of claim 1 wherein said slot diaphragm consists of a metal having a high melting point with a graphite coating.

13. The electron-optical system of claim 9 wherein said focusing means includes a means for rotating said line of said beam.

14. The electron-optical system of claim 16 wherein said means for rotating said beam line is a Wehnelt electrode with auxiliary voltages supplied thereto.

15. The electron-optical system of claim 1 wherein said intermediate image plane is disposed at a second of said beam crossover points in a direction of beam travel and further comprising a beam blanking system disposed at said intermediate image plane.

16. The electron-optical system of claim 1 wherein said third lens means is a projection lens disposed immediately above said target location in a direction of beam travel having a fine focus coil with compensated image rotation.

17. The electron-optical system of claim 1 further comprising an anode and wherein a first of said beam crossovers in a direction of beam travel is disposed behind said anode.

* * * * *